| United States Patent [19] | [11] | 4,320,189 |
|---|---|---|
| Taguchi et al. | [45] | Mar. 16, 1982 |

[54] PHOTOPOLYMERIZABLE COMPOSITION CONTAINING S-TRIAZINE COMPOUND

[75] Inventors: Tadashi Taguchi, Kawasaki; Toshihide Takemoto, Yokohama; Noboru Fujikawa, Tokyo; Mitsuo Kohno, Yokohama, all of Japan

[73] Assignee: Asahi Kasei Kogyo Kabushiki Kaisha, Tokyo, Japan

[21] Appl. No.: 191,965

[22] Filed: Sep. 29, 1980

[30] Foreign Application Priority Data

Oct. 3, 1979 [JP] Japan ................................ 54-127584

[51] Int. Cl.³ ................................................ G03C 1/68
[52] U.S. Cl. ..................................... 430/288; 430/281; 430/286; 430/287; 430/920; 204/159.18; 204/159.23
[58] Field of Search ............... 430/281, 286, 287, 288, 430/905, 920; 204/159.18, 159.23

[56] References Cited

U.S. PATENT DOCUMENTS

| 3,622,334 | 11/1971 | Matawan et al. | 430/281 |
| 3,954,475 | 5/1976 | Bonham et al. | 430/920 |
| 4,189,323 | 2/1980 | Buhr | 430/281 |
| 4,239,850 | 12/1980 | Kita et al. | 204/159.18 |
| 4,258,123 | 3/1981 | Nagashima et al. | 430/920 |
| 4,259,432 | 3/1981 | Kondoh et al. | 430/281 |

*Primary Examiner*—Jack P. Brammer
*Attorney, Agent, or Firm*—Sprung, Felfe, Horn, Lynch & Kramer

[57] ABSTRACT

A novel photopolymerizable composition comprising (a) a non-gaseous ethylenically unsaturated compound, (b) a thermoplastic organic polymer binder, (c) a photopolymerization initiator and (d) a specific s-triazine compound provides improved adhesion of a photopolymer prepared therefrom to a substrate even in aqueous plating or etching solutions.

8 Claims, No Drawings

PHOTOPOLYMERIZABLE COMPOSITION CONTAINING S-TRIAZINE COMPOUND

The present invention relates to a novel photopolymerizable composition. More particularly, the invention relates to an improved photopolymerizable composition which is useful as a photoresist composition from which a photoresist useful in aqueous plating or etching solutions is produced.

A photoresist composition is applied or heat-laminated onto a suitable substrate, e.g., a copper-clad epoxy glass-fiber board, and exposed to actinic light through a transparency to polymerize the composition in the exposed areas. The photoresist composition in the unexposed areas is washed away with a suitable liquid developer, and a resist image is produced. The substrate having the resist thereon is then subjected to any of various treatments such as etching, plating and anodic treatment to modify the unprotected surface of the substrate for providing a product such as a printed circuit board.

When the resist is used in an aqueous etching or plating or like solution, an insufficient adhesion of the resist to the substrate may permit the solution to infiltrate into between the resist and the substrate so that the hardened areas of the resist film are undercut by the solution. This may result in separation or lifting of the resist from the substrate, leading to losses of the resist edges in the case of etching or deposition of a metal on the substrate even under the resist in the case of plating. Therefore, a large decrease in precision of the pattern formed may be caused by the losses of some areas of the pattern and/or the loss of edge definition in the pattern. For this reason, a large number of boards must of necessity be discarded as rejected products.

It is, therefore, an object of the present invention to provide a photopolymerizable composition which gives a photoresist with much improved adhesion to a substrate.

In accordance with the present invention, there is provided a photopolymerizable composition which comprises:

(a) at least one non-gaseous ethylenically unsaturated compound having at least two terminal ethylenic groups and capable of forming a high polymer with the aid of a photopolymerization initiator activated by actinic radiation, (b) at least one thermoplastic organic polymer binder, (c) at least one photopolymerization initiator activatable by actinic radiation, and (d) at least one s-triazine compound represented by the formula:

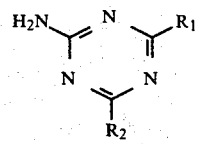

wherein $R_1$ and $R_2$ each independently stands for a hydrogen atom, an amino group, an aryl group, a straight chain or branched ($C_1$–$C_4$)alkyl group, a straight chain or branched ($C_1$–$C_4$)alkylamino group, or a halogen atom.

In the above formula, the aryl group that may represent $R_1$ and/or $R_2$ may be a phenyl or naphthyl group unsubstituted or substituted with one or two members selected from straight chain or branched ($C_1$–$C_4$)alkyl groups, and the halogen atom may be chlorine, bromine, fluorine or iodine.

An s-triazine compound present in the photopolymerizable composition of the present invention so greatly improves the adhesion of a resist prepared from the composition to a substrate that the resist does not involve the foregoing problems which accompany the treatment such as etching or plating. It has never been known that any triazine compounds promote the adhesion of a resist prepared from a composition containing the same to a metallic substrate.

Specific examples of the s-triazine compound to be used in the composition of the present invention include melamine, guanamine, acetoguanamine, benzoguanamine, 2-ethyl-4,6-diamino-s-triazine, 2,4-diamino-s-triazine, 2,4-diamino-6-tolyl-s-triazine, 2,4-diamino-6-xylyl-s-triazine and 2-amino-4-methyl-6-phenyl-s-triazine. They may be used either alone or in combination. The amount of the s-triazine compound to be used in the photopolymerizable composition, though its upper limit is governed by the solubility of the compound in the composition, may be in the range of from 0.1 to 5% by weight, preferably in the range of from 0.5 to 2% by weight, based on the composition.

The photopolymerizable composition of the present invention contains a non-gaseous ethylenically unsaturated compound and a thermoplastic organic polymer binder compatible with said compound. The ethylenically unsaturated compound to be used in the composition of the present invention has at least two terminal ethylenic groups for giving a high polymer with the aid of a photopolymerization initiator activated by actinic radiation, and may have a boiling point of 100° C. or more under atmospheric pressure. As the ethylenically unsaturated compound, there can be mentioned, for example, acrylic esters, metacrylic esters, acrylamide derivatives, methacrylamide derivatives, allyl compounds, vinyl ether compounds and vinyl ester compounds. Specific examples of the ethylenically unsaturated compound include acrylic or methacrylic esters such as polyacrylic or polymethacrylic esters of polyhydric alcohols, wherein the prefix "poly" means "di" or more and wherein specific examples of the polyhydric alcohols include polyethylene glycol, polypropyrene glycol, neopentyl glycol, trimethylolpropane, pentaerythritol, butanediol and trimethylolethane; acryl- or methacryl-amide derivatives such as methylene-bis-acrylamide, methylene-bis-methacrylamide, ethylene-bis-acrylamide, ethylene-bis-methacrylamide, hexamethylene-bis-acrylamide and hexamethylene-bis-methacrylamide; allyl compounds such as diallyl esters or phthalic acid, adipic acid, malonic acid or the like; vinyl ether compounds such as polyethers of vinyl alcohol and a polyhydric alcohol, specific examples of which are mentioned above; and vinyl ester compounds such as divinyl succinate, divinyl adipate and divinyl phthalate. Acrylic esters and methacrylic esters are most preferred in the composition of the present invention. The viscosity average molecular weight of polyethylene glycol or polypropylene glycol as mentioned above is not critical, but is usually up to 10,000, preferably up to 5,000. The above mentioned ethylenically unsaturated compounds may be used either alone or in mixture. The amount of the ethylenically unsaturated compound may be in the range of from 20 to 60% by weight based on the photopolymerizable composition.

The thermoplastic organic polymer binder to be used in the composition of the present invention may be chosen with compatibility thereof with the ethylenically unsaturated compound used being taken into consideration. Specific examples of the polymer binder to be employed in the composition of the present invention include methyl methacrylate homopolymer and copolymers with a monomer or monomers such as methacrylic acid, acrylic acid, methyl acrylate, butyl acrylate, etc.; styrene homopolymer and copolymers with a monomer or monomers such as methyl methacrylate, acrylonitrile, butadiene, etc.; vinyl chloride homopolymer and copolymers with a monomer or monomers such as vinyl acetate, vinylidene chloride, etc.; vinyl acetate homopolymer and copolymers with a monomer or monomers such as ethylene, vinyl chloride, etc.; chlorinated polyethylene; polyvinyl alcohol; and polyvinyl butyral. They may be used either alone or in mixture. The amount of the polymer binder may be in the range of from 30 to 77% by weight based on the photopolymerizable composition. The viscosity average molecular weight of the organic polymer binder is not critical and any polymer binder may be used so far as it can be removed by washing away with a liquid developer at the step of development. In general, the viscosity average molecular weight of the polymer binder may be 5,000 to 1,000,000, preferably 10,000 to 300,000.

Most of photopolymerization initiators as commonly used can be used in the photopolymerizable composition of this invention. Specific examples of photopolymerization initiators especially suitable for the polymerization of ethylenically unsaturated compounds include anthraquinone, and derivatives of anthraquinone such as 2-methyl-anthraquinone and 2-ethyl-anthraquinone; benzoin, and derivatives of benzoin such as benzoin methyl ether and benzoin ethyl ether; benzophenone, and derivatives of benzophenone such as Michler's ketone [4,4'-bis-(dimethylamino)benzophenone]; and quinone compound such as phenanthrenequinone. They may be used either alone or in combination. The amount of the photopolymerization initiator may be in the range of from 1 to 10% by weight based on the photopolymerizable composition.

In addition to the essential ingredients (a), (b), (c) and (d), the photopolymerizable composition of this invention may comprise a polymerization inhibitor for preventing the thermal polymerization, during storage, of the photopolymerizable composition, a dye or pigment for making a resist prepared from the composition easy to see, and/or a plasticizer for improving the physical and chemical properties of the composition.

The photopolymerizable composition of the present invention is applied onto a suitable substrate. For example, the photopolymerizable composition may be coated onto a suitable film support and the resulting photopolymerizable layer with the film support may be laminated onto a copper-clad epoxy glass-fiber board. Before or after the the film support is stripped, the photopolymerizable layer is exposed to actinic light through a transparency which may be a process negative or positive, followed by washing-away of the unexposed areas of the photopolymer film with a suitable liquid developer such as 1,1,1-trichloroethane to form a pattern on the board. The exposed copper layer of the board which is not protected by the resist may be etched away with an etching solution such as a ferric chloride solution to form an etched pattern, or plated with a metal or metals such as copper and/or solder to form a plated pattern.

The photopolymerizable composition of the present invention is useful for the production of a photoresist which is suitable especially for plating and etching and also suitable for soldering. The composition of this invention may also be used as an UV ink (an ink curable by exposure to ultraviolet light) and for the preparation of relief images and printing plates.

The viscosity average molecular weight ($\overline{M}v$) shown in this specification is calculated from the intrinsic viscosity [$\nu$] at 25° C. of a solution of a polymeric material in a solvent, using the following equation. The intrinsic viscosity is examined using an Ostwald's viscometer.

$$[\nu] = K\overline{M}_v^\alpha$$

(wherein K and $\alpha$ are constants inherent of the kind of the polymeric material).

For example, with respect to polymethyl methacrylate and polystyrene, solvents to be used and constants K and $\alpha$ are listed as follows.

|  | Solvent | K | $\alpha$ |
|---|---|---|---|
| polymethyl methacrylate | chloroform | $4.85 \times 10^{-6}$ | 0.80 |
| Polystyrene | benzene | $1.0 \times 10^{-4}$ | 0.74 |

The viscosity average molecular weight ($\overline{M}v$) is substantially the same as the weight average molecular weight ($\overline{M}w$).

The following Examples illustrate the present invention in more detail but should not be construed as limiting the scope of the invention.

EXAMPLE 1 AND COMPARATIVE EXAMPLE 1

The following photoresist composition was prepared.

| | |
|---|---|
| Polymethyl methacrylate ($\overline{M}v$ = 80,000) | 40g |
| Trimethylolpropane triacrylate | 30g |
| Tricresyl phosphate | 5g |
| Benzophenone | 3g |
| Michler's ketone | 0.6g |
| p-Methoxyphenol | 0.03g |
| Methyl Violet | 1g |

Five additional batches of the above composition were also prepared. To each batch of the composition, 0.5 g of one of the following s-triazine compounds was added. Thus, five kinds of photoresist compositions each containing one of the five s-triazine compounds were prepared.

| | |
|---|---|
| Compound 1 | Acetoguanamine |
| Compound 2 | Benzoguanamine |
| Compound 3 | 2,4-Diamino-6-tolyl-s-triazine |
| Compound 4 | 2-Ethyl-4,6-diamino-s-triazine |
| Compound 5 | 2-Amino-4-methyl-6-phenyl-s-triazine |

Each composition dissolved in methyl ethyl ketone was coated onto a 25μ-thick polyethylene terephthalate film and dried to form a photopolymerizable layer having a thickness of 25μ, which was then laminated onto a copper-clad epoxy glass-fiber board and exposed for 20 seconds through a transparency to actinic light from a 2 KW superhigh pressure mercury vapor lamp Phoenix 3,000 (trade name of a product manufactured by Ork Manufacturing Co., Ltd., Japan). The polyethylene terephthalate film was then peeled off, and 1,1,1-trichloroethane was jetted for one minute to the laminate board from a spray nozzle to effect development. The resulting laminate board was washed with water and dried.

An adhesive tape pickoff test, in which a cellophane pressure-sensitive adhesive tape is stuck to a resist remaining on a substrate and then pulled off very quickly, showed that the resists formed from the compositions each containing one of the five s-triazine compounds remained stuck to the copper-clad epoxy glass-fiber boards, and that the resist formed from the composition containing no s-triazine compound was peeled off together with the cellophane adhesive tape.

Each resist copper board (copper-clad epoxy glass-fiber board having a resist thereon) was dipped for 30 seconds in an aqueous solution of 200 g/liter of ammonium persulfate, washed with water, and subjected to a 30 minute copper-plating in a bath of a copper pyrophosphate plating solution Pyrodon Conc. (trade name of a plating solution manufactured by Harshaw Murata Company, Japan) which bath was operated at 1.0 volt with a cathode current density of 3.0 A/100 cm$^2$. In the case of the resist formed from the composition containing no s-triazine compound, there was observed lifting of the resist from the copper-clad board which might have been caused by the infiltration of the plating solution into between the resist and the copper-clad board. In the case of the resists formed from the compositions each containing one of the five s-triazine compounds, such lifting did not occur.

Then, each copper-plated board was subjected to a 12 minute solder-plating in a bath of a borofluoride solder-plating solution (manufactured by Sumitomo 3M Limited, Japan) which bath was operated at 0.5 volt with a cathode current density of 2.0 A/100 cm$^2$, followed by removal from the bath, washing with water and drying. Each solder-plated board was observed. In the case of the resist formed from the composition containing no s-triazine compound, the areas of the copper-plated board even under the resist underwent the solder-plating. In the case of the resists formed from the compositions each containing one of the five s-triazine compounds, no solder-plating occurred under the resist because the resist remained firmly stuck to the copper-clad board.

After peeling off the resist, each solder-plated board was subjected to etching in an etching solution (an aqueous solution of 200 g/liter of ammonium persulfate) capable of etching away copper but incapable of etching solder to form a solder pattern. The resist formed from the composition containing no s-triazine compound provided an unclear solder pattern, whereas the resists formed from the compositions each containing one of the five s-triazine compound provided clear solder patterns.

EXAMPLE 2 AND COMPARATIVE EXAMPLE 2

Six resist copper boards were prepared in the same manner as in Example 1.

Each resist copper board was etched in 45° Baumé ferric chloride. In the case of the resist formed from the composition containing no s-triazine compound, lifting of the resist from the copper-clad board was observed in some areas, and the copper pattern left after peeling off the resist was poor in edge definition and smaller in width than the resist pattern. In the case of the resists formed from the compositions each containing one of the five s-triazine compounds, such lifting did not occur at all, and the copper patterns left after peeling off the resists were all clear, excellent in edge definition and substantially the same in width as the corresponding resist patterns.

EXAMPLE 3

Five batches of the following compositions were prepared.

| | |
|---|---|
| Polymethyl methacrylate ($\overline{Mv}$ = 60,000) | 40g |
| Trimethylolpropane triacrylate | 10g |
| Tetraethylene glycol diacrylate | 10g |
| Triethylene glycol diacetate | 3g |
| Benzoguanamine | 0.3g |
| Malachite Green | 0.6g |

To each batch of the composition was added one of the following photopolimerization initiators. Thus, five kinds of photoresist compositions were prepared.

| | |
|---|---|
| 2-Ethylanthraquinone | 2.0g |
| Benzoin ethyl ether | 1.0g |
| Benzophenone | 2.0g |
| Acetophenone | 3.0g |
| Phenanthrenequinone | 2.0g |

Each of the above compositions (dissolved in methyl ethyl ketone) was coated into a layer, laminated, exposed, developed, copper-plated, and solder-plated as in Example 1. All of the resists formed from the five kinds of compositions performed excellently without any trouble, and the resulting boards were all suitable for use as printed circuit boards.

EXAMPLE 4

Three batches of the following photoresist composition were prepared.

| | |
|---|---|
| Styrene-acrylonitrile copolymer (styrene: acrylonitrile = 85:15 in moles, $\overline{Mv}$ = 150,000) | 40g |
| Pentaerythritol triacrylate | 25g |
| Triethylene glycol diacetate | 5.2g |
| 2-Methylanthraquinone | 2.5g |
| Methyl Violet | 0.3g |
| Methylhydroquinone | 0.1g |

To one batch of the above composition (dissolved in methyl ethyl ketone) was added 1.5 g of benzoguanamine to prepare another photoresist composition. To another batch of the above composition was added 1.5 g of 2,4-diamino-6-tolyl-s-triazine to prepare still another photoresist composition. To the remaining batch of the above composition was added no s-triazine compound. Thus, three kinds of photoresist compositions were prepared.

Each photoresist composition was coated onto a biaxially oriented polypropylene film and dried to form a photopolymerizable layer of 38$\mu$ in thickness, which was then laminated and exposed in the same manner as in Example 1. The polypropylene film was peeled off, and the laminate board was subjected to copper-plating and solder-plating in the same manner as in Example 1.

The resists formed from the compositions each containing one of the above-mentioned two s-triazine compounds did not allow unfavorable metal deposition in the areas under the resists to occur in copper-plating and in solder-plating, and provided very clear patterns. The resist formed from the composition containing no s-triazine compound permitted unfavorable metal deposition in the areas under the resist, and provided an unclear pattern which was poor in edge definition and even disconnected in the portions corresponding to those of the original pattern very small in line width.

EXAMPLE 5

Three batches of the following photoresist composition were prepared.

| | |
|---|---|
| Chlorinated polyethylene 907LTA (trade name of a product manufactured by Sanyo-Kokusaku Pulp Company, Ltd., Japan) | 40g |
| Trimethylolpropane triacrylate | 12g |
| Triethylene glycol dimethacrylate | 12g |
| Triethylene glycol dimethacrylate | 12g |
| Triphenyl phosphate | 4g |
| 2-Ethylanthraquinone | 2g |
| Victoria Blue | 0.1g |

To one batch of the above composition (dissolved in methyl ethyl ketone) were added 0.2 g of benzoguanamine and 0.1 g of 2,4-diamino-6-tolyl-s-triazine to prepare another photoresist composition. To another batch of the above composition was added 0.3 g of 2-amino-4-ethyl-6-phenyl-s-triazine to prepare still another photoresist composition. To the remaining batch of the above composition was added no s-triazine compound. Thus, three kinds of photoresist compositions were prepared.

Each photoresist composition was coated onto a polyethylene terephthalate film and dried to form a photopolymerizable layer of 38μ in thickness, which was then laminated and exposed in the same manner as in Example 1. The polyethylene terephthalate film was peeled off, and the laminate board was subjected to copper-plating and solder-plating in the same manner as in Example 1.

The resists formed from the compositions each containing the one or two s-triazine compounds did not allow unfavorable metal deposition in the areas under the resists to occur in copper-plating and in solder-plating, and provided very clear patterns. The resist formed from the composition containing no s-triazine compound permitted unfavorable metal deposition in the areas under the resist, and provided an unclear pattern which was poor in edge definition.

What is claimed is:

1. A photopolymerizable composition which comprises:
   (a) at least one non-gaseous ethylenically unsaturated compound having at least two terminal ethylenic groups and capable of forming a high polymer with the aid of a photopolymerization initiator activated by actinic radiation,
   (b) at least one thermoplastic organic polymer binder,
   (c) at least one photopolymerization initiator activatable by actinic radiation, and
   (d) at least one s-triazine compound represented by the formula:

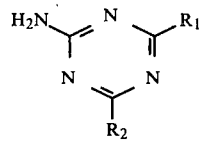

wherein $R_1$ and $R_2$ each independently stands for a hydrogen atom, an amino group, an aryl group, a straight chain or branched ($C_1$-$C_4$)alkyl group, a straight chain or branched ($C_1$-$C_4$)alkylamino group, or a halogen atom.

2. A photopolymerizable composition as claimed in claim 1, wherein said aryl group is a phenyl or naphthyl group unsubstituted or substituted with one or two members selected from straight chain or branched ($C_1$-$C_4$)alkyl groups.

3. A photopolymerizable composition as claimed in claim 1 or 2, wherein said at least one s-triazine compound (d) is present in an amount of 0.1 to 5% by weight based on the composition.

4. A photopolymerizable composition as claimed in claim 3, wherein said at least one s-triazine compound (d) is present in an amount of 0.5 to 2% by weight based on the composition.

5. A photopolymerizable composition as claimed in any one of claims 1 or 2, wherein said at least one ethylenically unsaturated compound (a) is a polyacrylic or polymethacrylic ester of a polyhydric alcohol.

6. A photopolymerizable composition as claimed in any one of claims 1 or 2, wherein said at least one thermoplastic organic polymer binder is a member selected from the group consisting of methyl methacrylate homopolymer and copolymers, styrene homopolymer and copolymers, vinyl chloride homopolymer and copolymers, vinyl acetate homopolymer and copolymers, chlorinated polyethylene, polyvinyl alcohol, and polyvinyl butyral.

7. A photopolymerizable composition as claimed in any one of claims 1 or 2, wherein 20 to 60% by weight of said at least one ethylenically unsaturated compound (a), 30 to 77% by weight of said at least one thermoplastic organic polymer binder (b) and 1 to 10% by weight of said at least one photopolymerization initiator (c) are present based on the composition.

8. A photopolymerizable composition as claimed in claim 1, wherein the photopolymerization initiator (c) is a member selected from the group consisting of anthraquinone and its derivatives, benzoin and its derivatives, benzophenone and its derivatives, and quinone compounds.

* * * * *